United States Patent
Usami

(12) 
(10) Patent No.: US 6,383,927 B2
(45) Date of Patent: *May 7, 2002

(54) PROCESS FOR FABRICATING SEMICONDUCTOR DEVICE, APPARATUS USING MORE THAN ONE KIND OF INERT GAS FOR EVACUATING AIR AND METHOD FOR ENTERING WAFER INTO THE APPARATUS

(75) Inventor: Tatsuya Usami, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/513,926

(22) Filed: Feb. 28, 2000

Related U.S. Application Data

(62) Division of application No. 09/192,299, filed on Nov. 17, 1998.

(30) Foreign Application Priority Data

Nov. 18, 1997 (JP) ................................................ 9-316932

(51) Int. Cl.[7] ............................................. H01L 21/44

(52) U.S. Cl. ........................ 438/680; 438/913; 438/795; 438/781

(58) Field of Search ................................. 438/680, 795, 438/913, 780–781

(56) References Cited

U.S. PATENT DOCUMENTS

| 4,415,385 A | | 11/1983 | Saito et al. | |
| 5,204,075 A | * | 4/1993 | Jain et al. | 423/219 |
| 5,295,668 A | | 3/1994 | Ohmi et al. | |
| 5,928,786 A | | 7/1999 | Mukogawa et al. | |
| 5,953,630 A | * | 9/1999 | Maeda et al. | 438/680 |

FOREIGN PATENT DOCUMENTS

| JP | 4-162526 | 6/1992 |
| JP | 7-335630 | 12/1995 |

* cited by examiner

*Primary Examiner*—Charles Bowers
*Assistant Examiner*—Thanh Nguyen
(74) *Attorney, Agent, or Firm*—McGinn & Gibb, PLLC

(57) ABSTRACT

Semiconductor wafers on a boat are inserted into a furnace chamber of a vertical oxidation/diffusion furnace, and helium gas and argon gas are injected into the furnace chamber during the insertion of the boat, so that the light helium gas fills the furnace chamber without residual air and the heavy argon gas pushes out the residual air from gaps between the semiconductor wafers.

19 Claims, 8 Drawing Sheets

PROCESS FOR FABRICATING SEMICONDUCTOR DEVICE, APPARATUS USING MORE THAN ONE KIND OF INERT GAS FOR EVACUATING AIR AND METHOD FOR ENTERING WAFER INTO THE APPARATUS

The present Application is a Divisional application of U.S. patent application Ser. No. 09/192,299, filed on Nov. 17, 1998.

FIELD OF THE INVENTION

This invention relates to a fabrication technology for a semiconductor device and, more particularly, to a process for fabricating a semiconductor device, a fabrication apparatus used therein and a method for entering a semiconductor wafer into the fabrication apparatus.

DESCRIPTION OF THE RELATED ART

An integrated circuit has been complicated, and the manufacturer is required to integrate a large number circuit components on a small semiconductor chip. The circuit component such as a field effect transistor is miniaturized, and the miniature field effect transistor requires an extremely thin gate oxide layer. When the manufacturer designs a field effect transistor under 0.25 micron design rules, the gate oxide layer is of the order of 8 nanometers thick. Now, the manufacturers are targeting a gate oxide layer of 5 nanometers thick or less.

Typical examples of oxidation technology are written in "Apparatus Technologies for Realizing Gate Oxide Equal to or Less Than 5 nm (DSI)", monthly magazine "Semiconductor World", July 1996, pages 103 to 108. Silicon wafers are inserted into a quartz boat, and the quartz boat is inserted into a furnace. The furnace chamber is purged with nitrogen, and residual oxygen at the entrance for the boat is of the order of 2 to 3 percent. However, natural oxide is grown to 10 to 20 angstroms thick on the silicon wafers in the furnace chamber at 800 degrees in centigrade. The nitrogen is smaller in molecular weight than the air, and hardly pushes out the air from the gaps between the silicon wafers. In other words, the air is hardly evacuated from the gaps between the silicon wafers.

The article proposes several apparatus against undesirable growth of natural oxide. One of the apparatus against the undesirable oxidation is a load-lock chamber provided under an entrance of a vertical oxidation diffusion furnace, and nitrogen gas flows across the gap between the load-lock chamber and the entrance of the furnace chamber. A lifter is installed in the load-lock chamber, and a boat is mounted on the lifter. The lifter is upwardly moved, and inserts the board into the furnace chamber. The nitrogen gas is expected to blow the air off.

Another apparatus is a nitrogen purge box attached to the furnace entrance. The boat is placed in the nitrogen purge box before the entry into the furnace chamber, and a large amount of nitrogen is blown into the nitrogen purge box. The nitrogen is expected to enter into the gaps between the silicon wafers, and the residual air is replaced with the nitrogen.

Yet another apparatus is a double wall furnace. The boat is inserted into the inner tube, and the nitrogen gas is blown into the inner tube. The air between the silicon wafers is replaced with the nitrogen. The inner tube is inserted into the outer tube, and the silicon wafer is heated.

The load-lock chamber and the nitrogen purge box are attached to a conventional furnace, and the manufacturer requires cost for remodeling the furnace. The double wall furnace is complicated, and is expensive. In any case, the manufacturer requires large cost for replacing the conventional furnace with the double wall furnace. Thus, the apparatus proposed in the article are not economical.

A prior art lateral oxidation diffusion furnace is proposed in Japanese Patent Publication of Unexamined Application No. 4-162526. The Japanese Patent Publication of Unexamined Application proposes to use inert gas larger in molecular weight than nitrogen for the inert gas purge. Argon is the inert gas larger in molecular weight than the nitrogen.

FIG. 1 illustrates a typical example of the vertical oxidation diffusion furnace, and the inert gas purge disclosed in the Japanese Patent Publication is applied to the vertical oxidation diffusion furnace. The prior art vertical oxidation diffusion furnace largely comprises a quartz tube 1, a lifter 2 and a quartz boat 3. The quartz tube 1 defines a furnace chamber 1a, and has an entrance 1b open to the atmosphere at the lower end thereof. The lifter 2 includes a table 2a and a drive mechanism 2b, and the table 2a is aligned with the entrance 1b. The driving mechanism 2b upwardly moves the table 2a and the vice versa, and the entrance 1b is closed by the table 2a. A warmer 4 is placed on the table 2a, and the quartz boat 3 is stacked on the warmer 4. A gas nozzle 5 and a gas exit 6 are provided to the quartz tube 1 around the entrance 1b. The gas nozzle 5 is connected to an argon gas source (not shown), and the gas exit 6 is connected to a vacuum source.

A manufacturer oxidizes silicon wafers 7 or diffuses dopant impurity into the silicon wafers 7 as follows. The driving mechanism 2b moves the table 2a to the lower limit, and the entrance 1b becomes open to the atmosphere. The silicon wafers 7 are inserted into the quartz boat 3, and the quartz boat 3 is placed on the warmer 4. The driving mechanism 2b upwardly moves the table 2a, and the quartz boat 3 is inserted into the furnace chamber 1a. The entrance 1b is closed. The argon gas is introduced from the gas nozzle 5 into the furnace chamber 1a, and is exhausted from the furnace chamber through the gas exit 6. Thus, the air is gradually evacuated from the furnace chamber 1a, and is replaced with the argon gas.

FIG. 2 illustrates another prior art vertical oxidation diffusion furnace. The difference from the prior art vertical oxidation diffusion furnace shown in FIG. 1 is the location of the gas nozzle 5, and components of the vertical oxidation diffusion furnace are labeled with the same references designating corresponding components of the prior art vertical oxidation diffusion furnace shown in FIG. 1.

The argon gas is larger in molecular weight than the air and the oxygen, and is expected to push out the residual oxygen from the gaps between the silicon wafers 7. However, a problem is encountered in the prior art furnaces in that the residual air is left in the furnace chamber, and the silicon wafers 7 are undesirably oxidized by the oxygen of the residual air.

SUMMARY OF THE INVENTION

It is therefore an important object of the present invention to provide a process for fabricating a semiconductor device, in which oxidation of a semiconductor wafer is precisely controlled without cost.

It is also an important object of the present invention to provide an apparatus for precisely controlling the oxidation of the semiconductor wafer.

It is also an important object of the present invention to provide a method for entering a semiconductor wafer into the apparatus.

The present inventor contemplated the problem inherent in the prior art, and noticed that the argon gas got under the residual air in the furnace chamber. The boat 3 is upwardly protected from the entrance 1b. Although the air was gradually replaced with the argon gas, the air was hardly evacuated from the upper portion of the furnace chamber 1a, and the residual air oxidized the silicon wafer at a higher level. The present inventor measured the residual oxygen in the furnace chamber 1a, and the oxygen concentration was greater than that in the prior art load-lock chamber, i.e., 10 ppm to 50 ppm. Thus, there was a trade-off between the inert gas lighter than the air and the inert gas heavier than the air. The present inventor concluded to share the evacuation work between different kinds of inert gas.

To accomplish the object, the present invention proposes to use gaseous mixture between a first kind of inert gas lighter than the oxygen and a second kind of inert gas heavier than the oxygen for the evacuation work.

In accordance with one aspect of the present invention, there is provided a process for fabricating a semiconductor device comprising the steps of preparing a semiconductor wafer having a portion of a first material reactive with oxygen, supplying a first purge gas less reactive with the first material and smaller in molecular weight than the oxygen and a second purge gas less reactive with the first material and larger in molecular weight than the oxygen during an insertion of the semiconductor wafer into a chamber, and carrying out a predetermined treatment on the portion in the chamber.

In accordance with another aspect of the present invention, there is provided an apparatus used in a fabrication of a semiconductor device comprising a wall defining a chamber having an entrance, a loader for inserting a semiconductor wafer having a portion of a first material reactive with oxygen through the entrance into the chamber, and a gas supplier connected to the wall and supplying a first purge gas less reactive with the first material and smaller in molecular weight than the oxygen and a second purge gas less reactive with the first material and larger in molecular weight than the oxygen into the chamber.

In accordance with yet another aspect of the present invention, there is provided a method for entering a semiconductor wafer into a chamber comprising the steps of preparing a semiconductor wafer having a portion of a certain material reactive with oxygen, supplying a first purge gas less reactive with the certain material and smaller in molecular weight than the oxygen and a second purge gas less reactive with the certain material and larger in molecular weight than the oxygen into a chamber, and inserting the semiconductor wafer into the chamber.

BRIEF DESCRIPTION OF THE DRAWINGS

The features and advantages of the process, the apparatus and the method will be more clearly understood from the following description taken in conjunction with the accompanying drawings in which.

DESCRIPTION OF THE PREFERRED EMBODIMENTS

Apparatus

Figure 1:
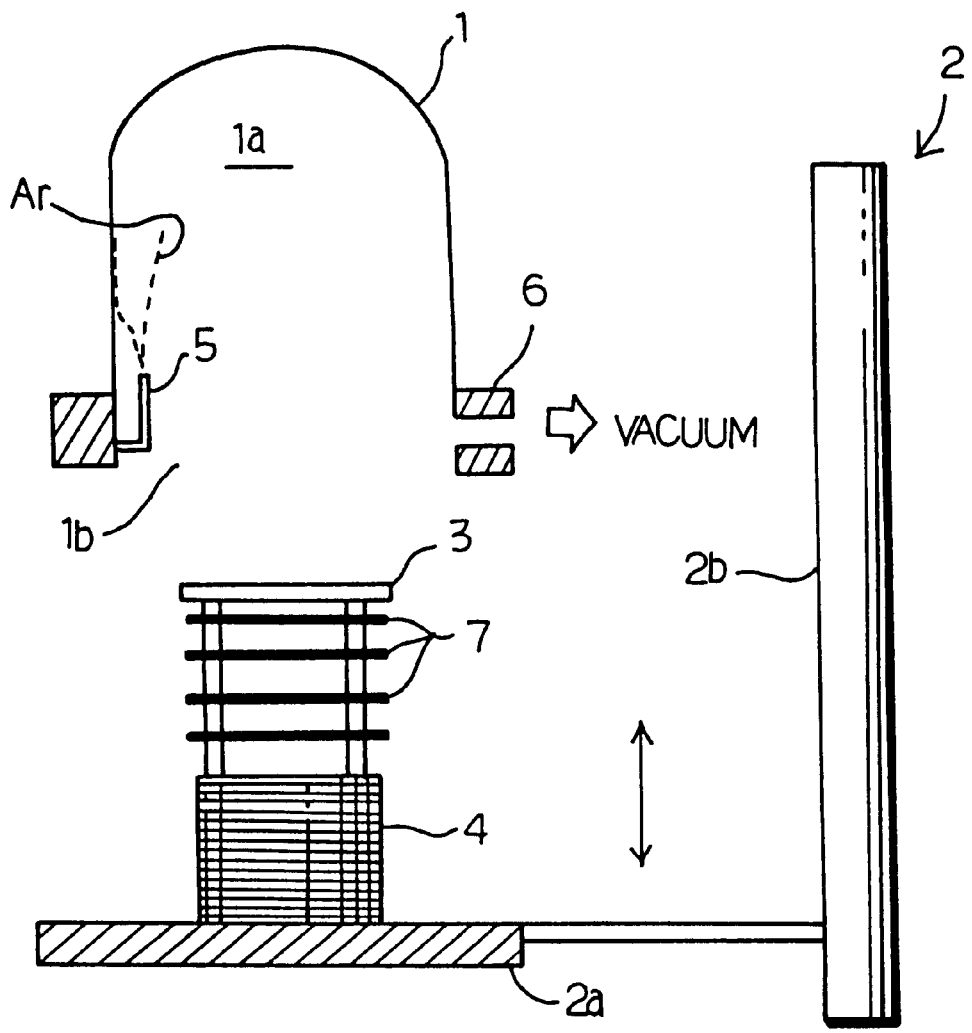
FIG. 1 is a cross sectional view showing the prior art vertical oxidation diffusion furnace to which the concept disclosed in Japanese Patent Publication of Unexamined Application No. 4-162526 is applied.
Figure 2:
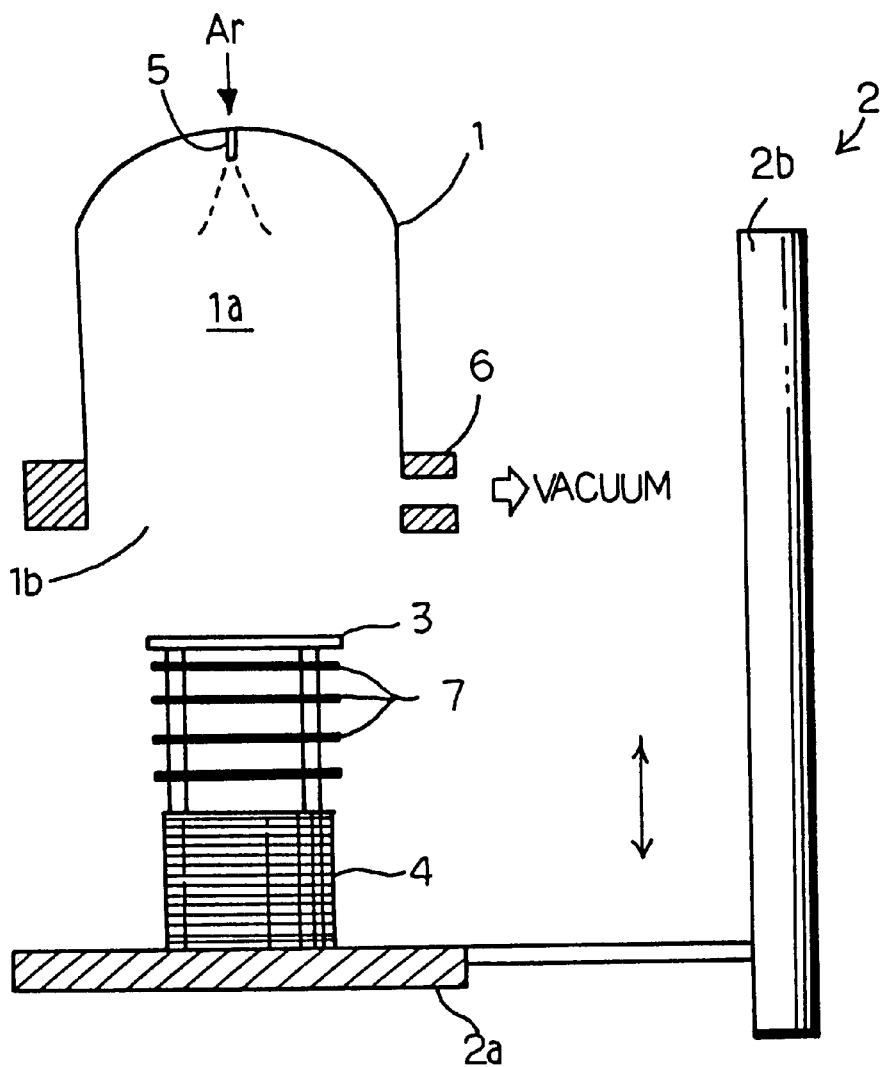
FIG. 2 is a cross sectional view showing another prior art vertical oxidation diffusion furnace modified on the basis of the prior art vertical oxidation diffusion furnace.
Figure 3:
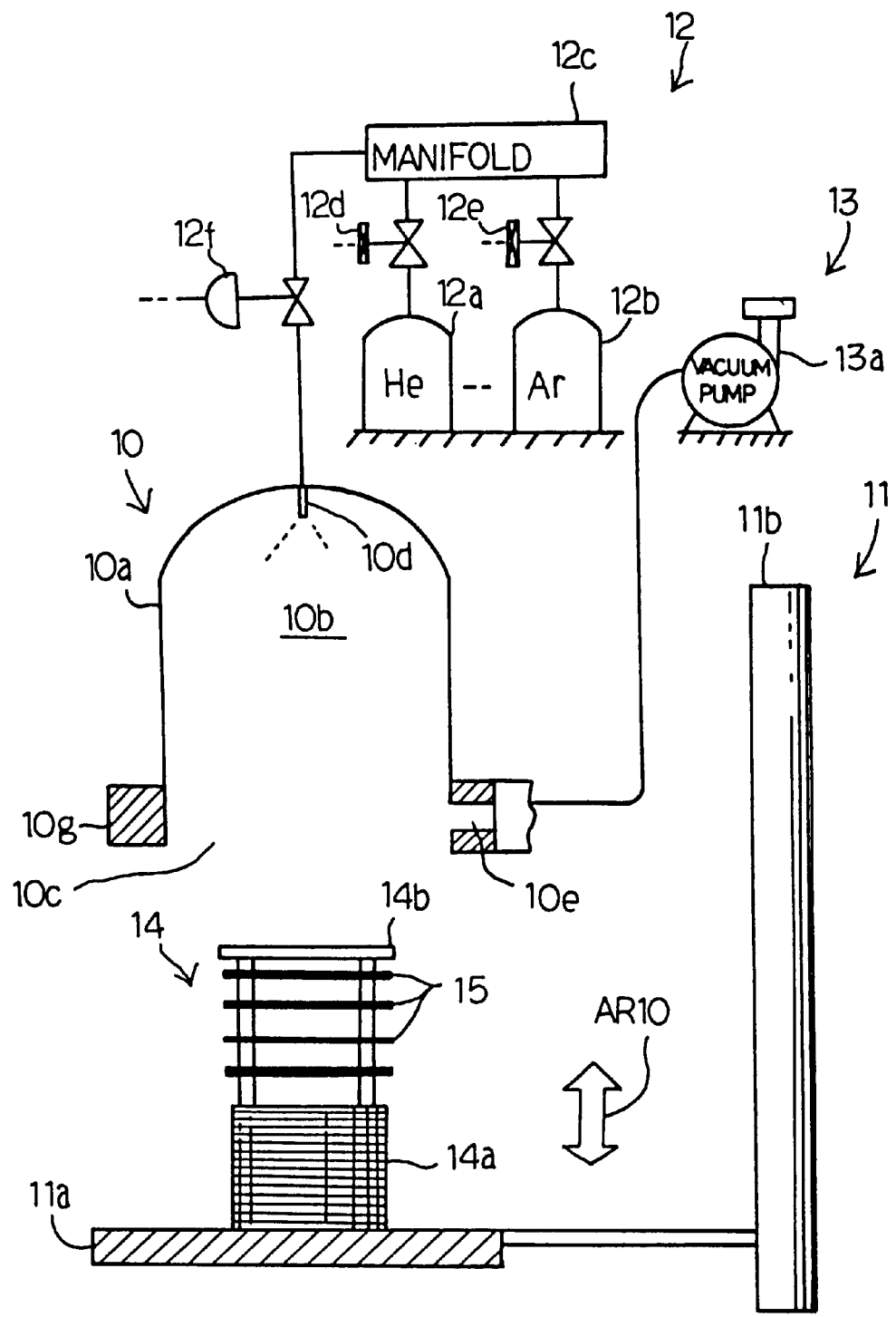
FIG. 3 is a cross sectional view showing a vertical furnace system according to the present invention.

Referring to FIG. 3 of the drawings, a vertical furnace system embodying the present invention largely comprises a quartz tube 10, a lifter 11, an inert gas supply sub-system 12, an evacuation sub-system 13 and a wafer retainer 14. The vertical furnace system may serve as an oxidation furnace and/or a diffusion furnace. A semiconductor wafer is partially oxidized in the oxidation furnace, and an oxide such as, for example, a silicon oxide is grown on or over the semiconductor wafer. The diffusion furnace diffuses a dopant impurity from a suitable source into the semiconductor wafer or a semiconductor layer over the semiconductor wafer. The vertical furnace system may form a part of a vapor phase deposition system such as, for example, a low-pressure vapor phase deposition system. In this application, the furnace chamber 10b serves as a reaction chamber, and semiconductor material or insulating material is, by way of example, deposited on a semiconductor wafer in the reaction chamber. Thus, the vertical furnace system is used in a fabrication process for a semiconductor device.

The quartz furnace 10 includes a furnace wall 10a formed of quartz. The furnace wall 10a defines a furnace chamber 10b, and the furnace chamber 10b is open to the air on the bottom side of the furnace wall 10a. The furnace chamber 10b has an entrance/exit 10c for the wafer retainer on the bottom side of the furnace wall 10a.

The quartz furnace 10 further includes an gas injector 10d attached to the furnace wall 10a and an exhaust port 10e formed around the entrance/exit 10c. The gas injector 10d projects from the top of the furnace wall 10a into the furnace chamber 10b, and is connected to the inert gas supply sub-system 12. Inert gaseous mixture is downwardly blown toward the wafer retainer 14. The exhaust port 10e is formed in a rim member 10g, and is open to the furnace chamber 10b. The furnace wall 10a is fixed to the rim member 10g, and the exhaust port 10e is connected to the evacuation sub-system 13.

The lifter 11 includes a table 11a and a driver mechanism 11b connected to the table 11a. The table 11a is located under the entrance/exit 10c, and the driver mechanism 11b upwardly moves the table 11a toward the entrance/exit 10c and vice versa as indicated by arrow AR10. While the driver mechanism 11b keeps the table at the lower limit, the wafer retainer 14 is placed on the table 11a, and is moved therefrom. When the driver mechanism 11b moves the table 11a to the upper limit, the table 11a closes the entrance/exit 10c, and the wafer retainer 14 is inserted into the furnace chamber 10b.

The inert gas supply sub-system 12 includes sources of inert gas 12a/12b, a manifold 12c for mixing different kinds of inert gas with one another, valve units 12d/12e connected between the sources 12a/12b of inert gas and the manifold 12c and a flow control valve 12f connected between the manifold 12c and the gas injector 10d. In this instance, helium gas and argon gas are stored in the sources 12a/12b of inert gas. The helium gas has the molecular weight less than the molecular weight of oxygen, and, accordingly, is lighter than the oxygen. On the other hand, the argon gas has the molecular weight greater than the molecular weight of the oxygen, and, accordingly, is heavier than the oxygen. The helium gas is expected to purge the oxygen of the air from the upper portion of the furnace chamber lob, and the argon gas is expected to push the oxygen of the air out from the gaps defined in the wafer retainer 14.

The evacuation sub-system 13 includes a vacuum pump 13a connected to the exhaust port 10e, and the vacuum pump 13a evacuates the gaseous mixture from the furnace chamber 10b.

The wafer retainer 14 includes a heater 14a and a boat 14b stacked on the heater 14a. Semiconductor wafers such as, for example, silicon wafers 15 are held by the board 14b at intervals. The wafer retainer 14 is placed on the table 11a, and is inserted into the furnace chamber 10b.

The vertical furnace system does not require any load-lock chamber, any nitrogen purge box or any double wall structure, and only the inert gas supply sub-system 12 is remodeled. For this reason, the vertical furnace system is simpler than the apparatus written in the article, and the manufacturer saves the expense for remodeling the vertical furnace system.

Moreover, the vertical furnace system shown in FIG. 3 occupies space narrower than the occupation space of the apparatus, and, accordingly, improves the space utility of the clean room.

Figure 4:
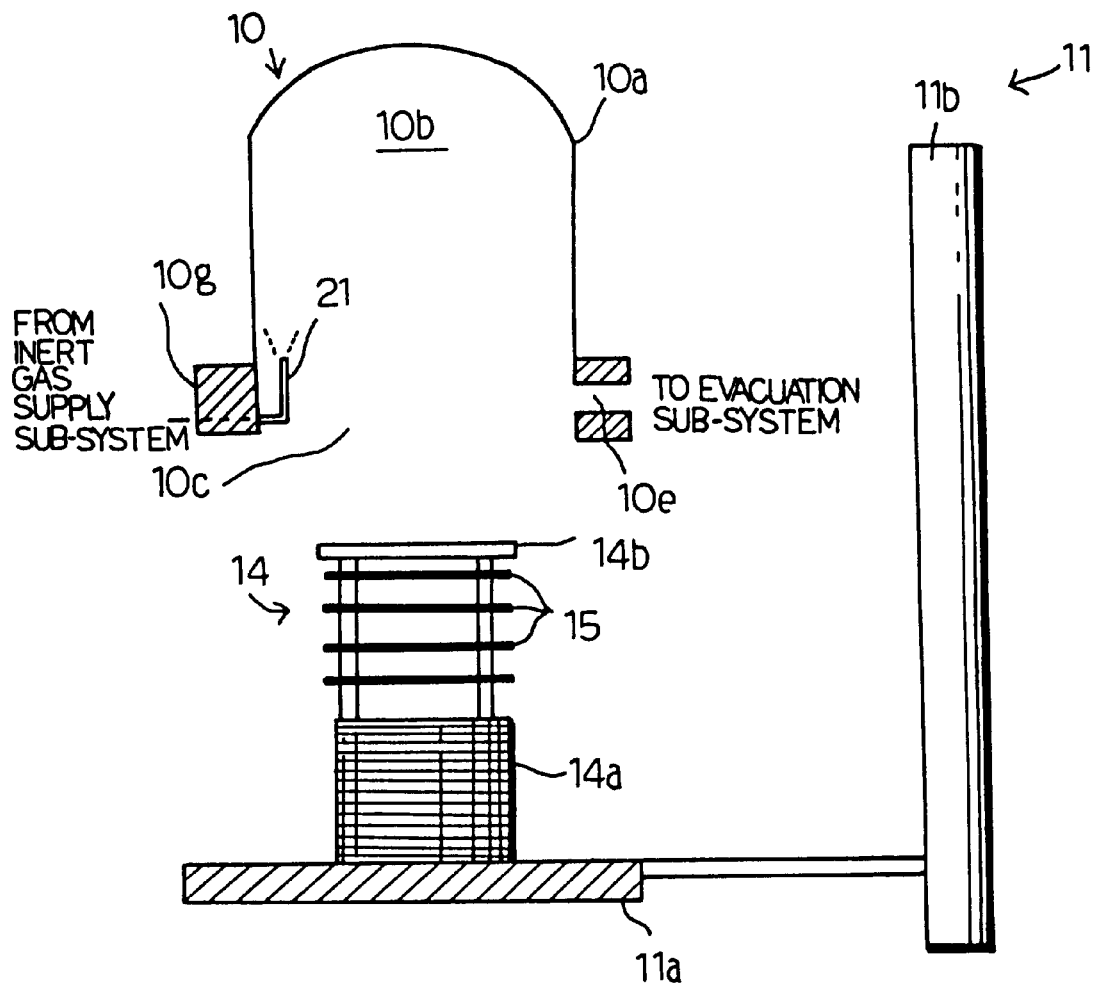
FIG. 4 is a cross sectional view showing another vertical furnace system according to the present invention.

The vertical furnace may have a quartz injector 21 instead of the gas injector 10d as shown in FIG. 4. The quartz injector 21 is attached to the rim member 10g, and upwardly blows the inert gaseous mixture toward the silicon wafers 15. The quartz injector 21 is desirable, because the manufacturer does not machine the furnace wall 10a of quartz. For this reason, the cost is further reduced.

Method for Entering Semiconductor Wafer into Furnace

Figure 5A:
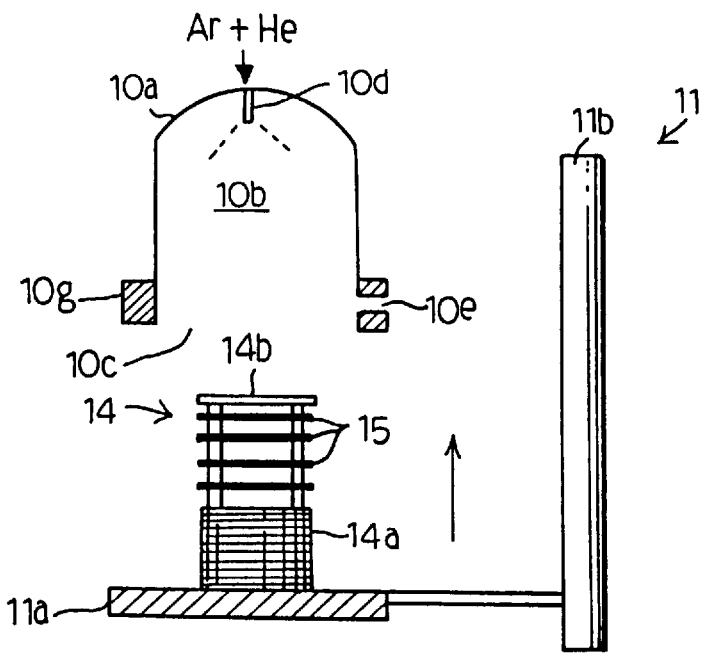
FIGS. 5A and 5B are cross sectional views showing a method for entering semiconductor wafers into a furnace chamber shown in FIG. 3 according to the present invention.
Figure 5B:
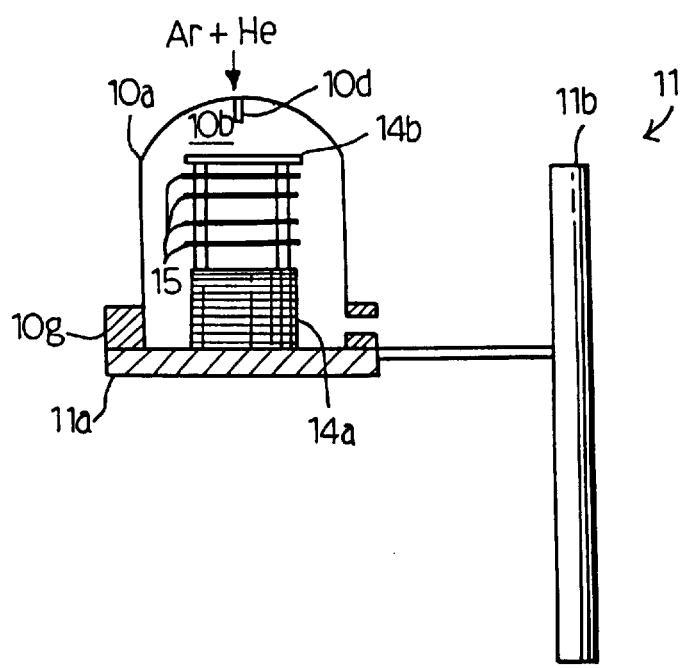

FIGS. 5A to 5B illustrate a method for entering silicon wafers into a furnace chamber embodying the present invention. The vertical furnace system shown in FIG. 3 is used in the method.

The method starts with preparation of the silicon wafers 15. The silicon wafers 15 are treated with dilute hydrofluoric acid, and natural oxide is perfectly removed from the surfaces of the silicon wafers 15. The silicon wafers 15 are inserted into the boat 14b at intervals, and the heater 14a and the boat 14b are placed on the table 11a. The driving mechanism 11b upwardly moves the table 11a at 70 cm per min as shown in FIG. 5A.

Inert gaseous mixture, i.e., gaseous mixture of the argon gas Ar and the helium gas He is blown from the injector 10d into the furnace chamber 10b, and the air is replaced with the inert gaseous mixture. In this instance, the argon gas Ar and the helium gas He are regulated to 20 litters per minute and 20 litters per minute, respectively. The helium gas He evacuates the air in the upper portion of the furnace chamber 10b, and the argon gas Ar evacuates the air in the lower portion of the furnace chamber 10b. Thus, the helium gas He and the argon gas Ar effectively evacuate the air from the furnace chamber 10b.

While the driving mechanism 11b is inserting the boat 14b into the furnace chamber 10b, the argon gas Ar pushes out the air from the gaps between the silicon wafers 15. The table 11a closes the entrance 10c, and the silicon wafers 15 are sealed in the furnace chamber 10b as shown in FIG. 5B.

When the silicon wafers 15 are sealed in the furnace chamber 10b, residual oxygen in the furnace chamber 10b is several ppm, and residual oxygen between the silicon wafers 15 ranges from 20 ppm to 30 ppm. The inert gaseous mixture is partially evacuated from the furnace chamber 10b. Thereafter, the manufacturer carries out a predetermined treatment such as, for example, oxidation, diffusion of dopant impurity or a vapor phase deposition in the furnace chamber 10b.

The present inventor investigated the inert gaseous mixture. The silicon wafers 15 were maintained at 800 degrees in centigrade during the insertion of the boat 14b into the furnace chamber 10b. The inert gaseous mixture was blown to the first sample as described hereinbefore. The present inventor measured the thickness of the natural oxide grown on the first sample, and the natural oxide layer was 10 angstroms thick.

For the comparison, the present inventor inserted a second sample into the furnace chamber 10b. Nitrogen was blown to the second sample, and the other conditions were similar to those of the first sample. The present inventor measured the thickness of the natural oxide layer grown on the second sample, and the thickness was 18 angstroms. The present inventor further inserted a third sample from the load-lock chamber into the furnace chamber written in the article of the monthly magazine "Semiconductor World". The nitrogen flowed through the gap between the load-lock chamber and the furnace chamber as described hereinbefore. The conditions were similar to those of the first sample except the nitrogen. The present inventor measured the thickness of the natural oxide layer, and the thickness was 9 angstroms. The natural oxide layer on the first example was much thinner than the natural oxide of the second sample, and was as thin as the natural oxide layer of the third sample. Thus, the inert gaseous mixture was effective against the growth of the natural oxide.

Figure 6A:
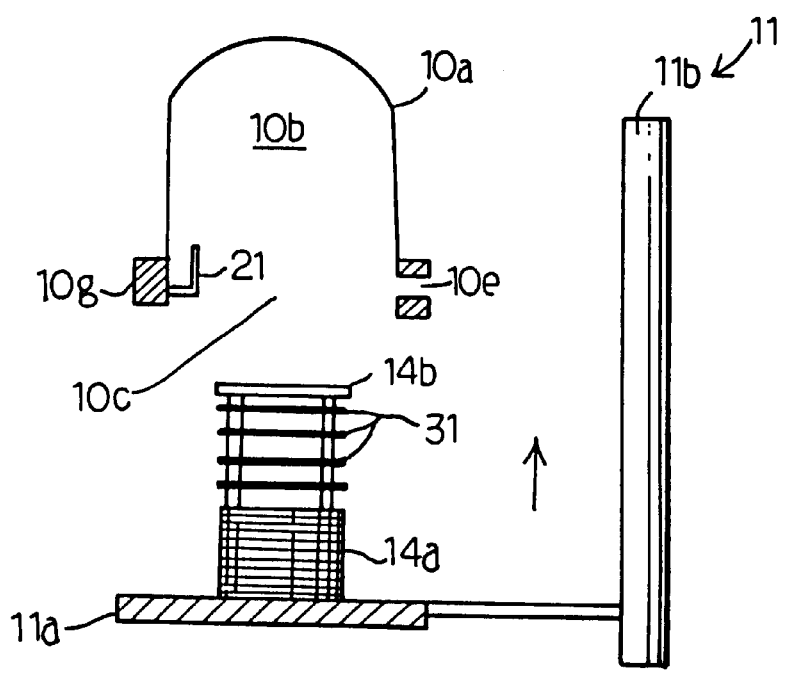
FIGS. 6A and 6B are cross sectional views showing a method for entering semiconductor wafers into a furnace chamber shown in FIG. 4 according to the present invention.
Figure 6B:
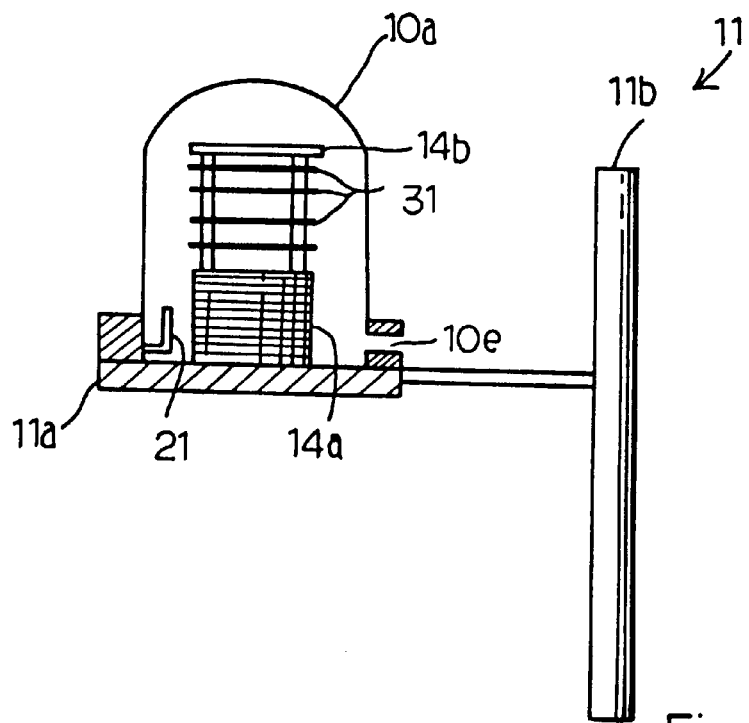

FIGS. 6A and 6B illustrate another method for entering a semiconductor wafer into a furnace chamber. The vertical furnace system shown in FIG. 4 is used in the second method. The method starts with preparation of silicon wafers 31 covered with insulating layers of hydrogen silsesquioxane. In detail, hydrogen silsesquioxane is spread over the silicon wafers 31, and is stepwise baked at 150 degrees in centigrade for one minute, 200 degrees in centigrade for one minute and 350 degrees in centigrade for one minute. The hydrogen silsesquioxane has Si—H bond, and oxygen replaces the Si—H bond to Si—OH bond. The Si—OH bond increases the dielectric constant of the hydrogen silsesquioxane. Thus, the hydrogen silsesquioxane is sensitive to residual oxygen during a baking step, and the dielectric constant of the hydrogen silsesquioxane is increased together with the oxygen concentration. The silicon wafers 31 are inserted into the boat 14b at intervals, and the heater 14a and the boat 14b are placed on the table 1 1a. The gas injector 21 blows the nitrogen into the furnace chamber 10b at 20 litters per minute, and the air is replaced with the nitrogen. Thus, the furnace chamber 10b is filled with the nitrogen before reaching the entrance 10c.

The driver mechanism 11b starts to upwardly move the table at 70 cm per minute as shown in FIG. 6A, and the gas injector 21 blows the argon gas at 10 litters per minute. While the driver mechanism 11b is inserting the boat 14b into the nitrogen atmosphere created in the furnace chamber 10b, the argon gas blows off the air, and pushes out the air from the gaps between the silicon wafers 31.

When the table 11a reaches the upper limit, the table 11a closes the entrance 10c, and the boat 14b is sealed in the furnace chamber 10b as shown in FIG. 6B.

The nitrogen is supplied from the gas injector 21 into the furnace chamber 10b, and the gaseous mixture between the nitrogen and the argon is replaced with the nitrogen only. Thereafter, the insulating layers of hydrogen silsesquioxane are baked at 400 degrees in centigrade for an hour.

The present inventor investigated the method according to the present invention. The present inventor prepared a first sample through the method. The present inventor further prepared a second sample through a method similar to that of the present invention except nitrogen blow. Only the nitrogen was blown to the second sample. The present inventor measured the dielectric constant of the hydrogen silsesquioxane layer of the first sample and the dielectric constant of the hydrogen silsesquioxane layer of the second sample. The dielectric constant of the first sample was 2.8, and the dielectric constant of the second sample was 3.1. The smaller dielectric constant taught us that the argon effectively evacuated the residual oxygen. Thus, the method according to the present invention was effective against the residual oxygen.

As will be understood from the foregoing description, the method according to the present invention effectively reduces the residual oxygen in the furnace chamber 10b.

Process for Fabricating Semiconductor Device

Figure 7A:
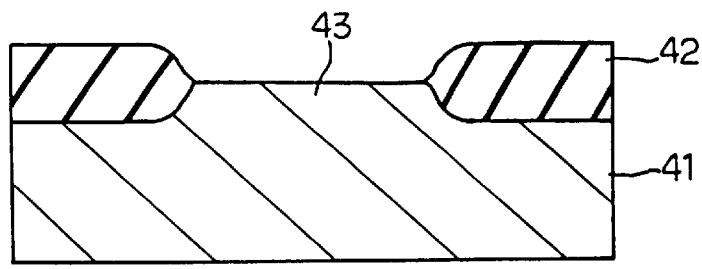
FIGS. 7A to 7D are cross sectional views showing a process for fabricating a semiconductor device according to the present invention.

FIGS. 7A to 7D illustrate a process for fabricating a semiconductor device embodying the present invention. The process starts with preparation of a silicon wafer 41, and a thick field oxide layer 42 is selectively grown on the major surface of the silicon wafer 41. The thick field oxide layer 42 defines active areas in the major surface, and only one active area 43 is shown in FIG. 7A.

Using either vertical furnace system shown in FIG. 3 or 4, a thin gate oxide layer 44 is grown on the active area 43. The silicon wafer 41 is treated with dilute hydrofluoric acid, and natural oxide is removed from the active area 43. The silicon wafer 4 1 and other silicon wafers are supported by the boat 14b, and boat 14b is mounted on the heater 14a. Using the method illustrated in FIGS. 5A and 5B, or 6A and 6B, the silicon wafer 41 is inserted into the furnace chamber 10b. While the lifter 11 is inserting the silicon wafer 41 into the furnace chamber 10b, the air in the furnace chamber 10b is perfectly replaced with the purge gaseous mixture, and the argon gas evacuates the residual oxygen from the gaps between the silicon wafers 41. For this reason, the natural silicon oxide on the active area 43 is negligible.

Figure 7B:
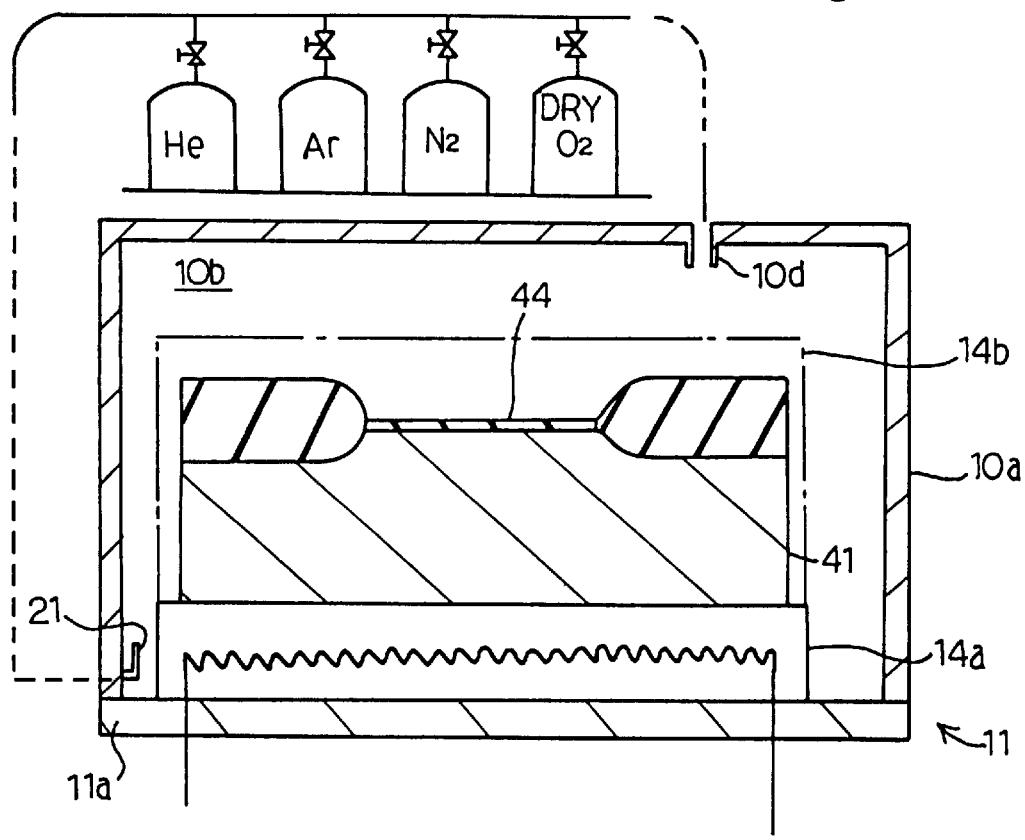

Subsequently, dry oxygen is introduced into the furnace chamber 10b, and the silicon wafer 41 is oxidized. As a result, an extremely thin silicon oxide layer 44 is grown on the active area 41 as shown in FIG. 7B. The extremely thin silicon oxide layer 44 is available for the miniature field effect transistor of the next generation.

Subsequently, polysilicon is deposited over the entire surface of the resultant structure, and forms a polysilicon layer. Photo-resist solution is spun onto the polysilicon layer, and is baked. A pattern image for a gate electrode is transferred from a photo-mask (not shown) to the photo-resist layer, and forms a latent image in the photo-resist layer. The latent image is developed, and the photo-resist layer is patterned into a photo-resist etching mask (not shown). Using the photo-resist etching mask, the polysilicon layer is partially etched away, and a polysilicon strip 45a is left on the active area 43.

Figure 7C:
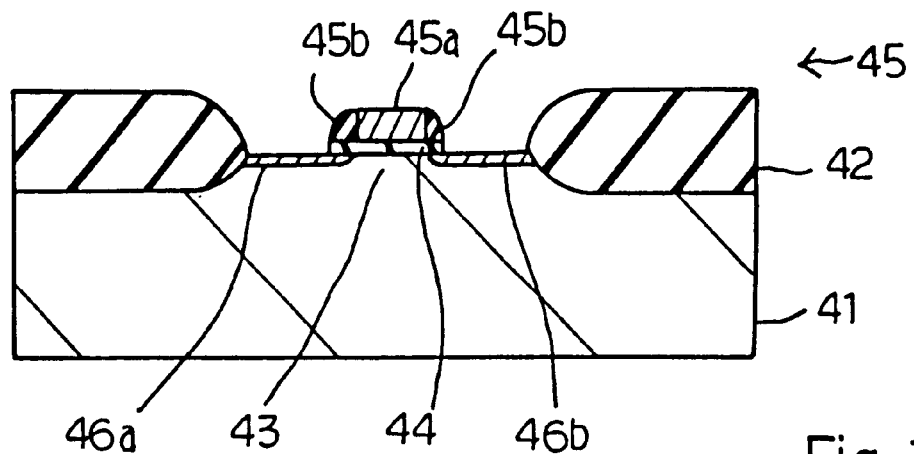

Using the polysilicon strip 45a as an ion-implantation mask, dopant impurity opposite in conductivity type to the silicon wafer 41 is introduced into the active area 43, and forms lightly-doped source and drain regions 46a/46b in the active area 43. Silicon oxide is deposited over the entire surface of the resultant structure, and forms a silicon oxide layer. The silicon oxide layer is anisotropically etched back, and is formed into side wall spacers 45b as shown in FIG. 7C.

Dopant impurity is ion implanted into the active area 43, and forms heavily doped source/drain regions 47a/47b. The heavily-doped source/drain regions 47a/47b are self-aligned with the side wall spacers 45b, and are nested in the lightly doped source/drain regions 46a/46b, respectively.

Figure 7D:
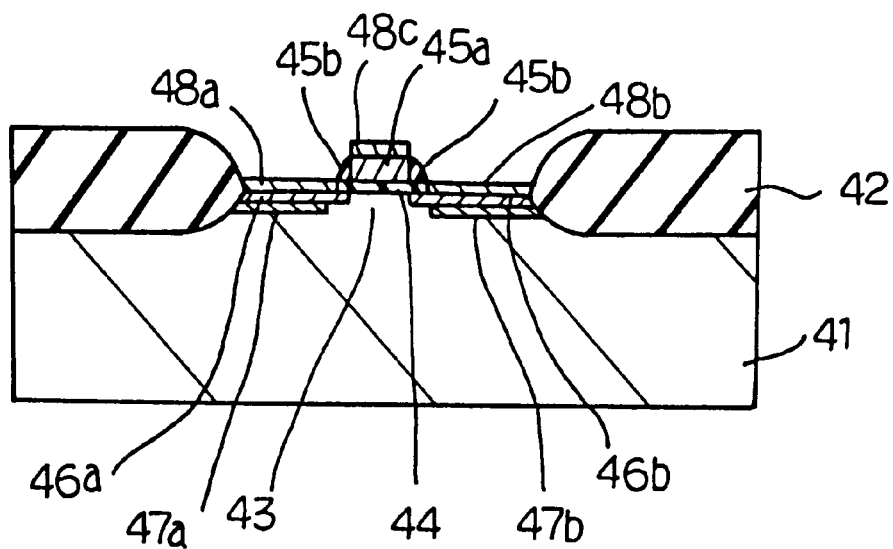

Refractory metal is deposited over the entire surface of the resultant structure, and forms a refractory metal layer. The refractory metal layer is partially held in contact with the heavily doped source/drain regions 47a/47b and the polysilicon strip 45a. The refractory metal layer reacts with the silicon, and is partially converted to refractory metal silicide. The remaining refractory metal is etched away, and refractory metal silicide strips 48a/48b /48c are left on the heavily doped source/drain regions 47a/47b and the polysilicon strip 45a, respectively, as shown in FIG. 7D.

Thus, the extremely thin silicon oxide layer 44 serves as a gate insulating layer of a miniature field effect transistor, and the miniature field effect transistor forms a part of an integrated circuit.

As will be understood from the foregoing description, the gas purge according to the present invention is appropriate for the miniature field effect transistor, and the miniature field effect transistor allows the manufacturer to increase the integration density without a large semiconductor chip.

Although particular embodiments of the present invention have been shown and described, it will be apparent to those skilled in the art that various changes and modifications may be made without departing from the spirit and scope of the present invention.

For example, the present invention is applicable to a lateral furnace system. If a kind of purge gas negligibly reacts with the semiconductor wafer in view of fabrication of a semiconductor device, the purge gas is available for the evacuation work according to the present invention. For example, nitrogen may be used as the inert gas lighter than the oxygen. Of course, other kinds of inert gas such as xenon, krypton and neon are available for the evacuation work.

The furnace system according to the present invention is used as the oxidation furnace, the diffusion furnace and the vapor phase deposition system as described hereinbefore. The furnace system is never limited to those applications. The furnace system is available for any purpose in so far as the manufacture needs to replace the atmosphere in the furnace chamber with another atmosphere.

The purge gas lighter than the oxygen and the purge gas heavier than the oxygen may be separately injected into the furnace chamber.

The semiconductor wafer may be formed of other semiconductor material such as, for example, compound semiconductor.

What is claimed is:

1. A process for fabricating a semiconductor device, comprising:

a) preparing a semiconductor wafer having a portion comprising hydrogen silsesquioxane;

b) supplying a first purge gas less reactive with said hydrogen silsequioxane and smaller in molecular weight than said oxygen and a second purge gas less reactive with said hydrogen silsequioxane and larger in molecular weight than said oxygen during an insertion of said semiconductor wafer into a chamber; and c) carrying out a predetermined treatment on said portion in said chamber.

2. The process as set forth in claim 1, in which said first purge gas is selected from the group consisting of helium and nitrogen, and said second purge gas is selected from the group consisting of neon, argon, krypton and xenon.

3. The process as set forth in claim 1, in which said hydrogen silsesquioxane is baked in said step c).

4. The process as set forth in claim 1, in which said chamber has an entrance on a bottom side thereof, and said semiconductor wafer and other semiconductor wafers are interspaced and supported by a boat.

5. The process as set forth in claim 4, in which said step b) further comprises:
   b-1) supplying said first purge gas into said chamber so that an atmosphere in said chamber is replaced with said first purge gas, and
   b-2) supplying said second purge gas into said chamber while said boat is being inserted into said chamber.

6. The process as set forth in claim 1, in which said treatment comprises one of oxidation of said first material, diffusion of a dopant impurity into said portion, and deposition of a second material over said portion.

7. The process as set forth in claim 1, wherein while said semiconductor wafer is being inserted into said chamber, said first purge gas purges an upper portion of said chamber, and said second purge gas purges a lower portion of said chamber.

8. The process as set forth in claim 1, wherein said first purge gas has a flow rate of about 20 liters per minute and the second purge gas has a flow rate of about 10 liters per minute.

9. The process as set forth in claim 1, wherein substantially no natural oxide layer is formed on said wafer during said predetermined treatment.

10. The process as set forth in claim 1, wherein said semiconductor wafer comprises a compound semiconductor.

11. The process as set forth in claim 1, wherein said semiconductor device comprises a miniature field effect transistor.

12. A process for fabricating a semiconductor device, comprising:
   a) preparing a semiconductor wafer having a portion comprising a first material reactive with oxygen;
   b) removing residual air from a chamber by supplying a first purge gas less reactive with said first material and smaller in molecular weight than said oxygen and a second purge gas less reactive with said first material and larger in molecular weight than said oxygen;
   c) while removing said residual air from said chamber, inserting and sealing said semiconductor wafer in said chamber; and
   d) carrying out a predetermined treatment on said portion in said chamber.

13. A method for entering a semiconductor wafer into a chamber, comprising:
   a) preparing a semiconductor wafer having a portion comprising a certain material reactive with oxygen;
   b) purging a chamber, said purging comprising:
      supplying a first purge gas less reactive with said certain material and smaller in molecular weight than said oxygen to purge an upper portion of said chamber; and
      supplying a second purge to gas less reactive with said first material and larger in molecular weight than said oxygen to purge a lower portion of said chamber; and
   c) while purging said chamber, inserting and sealing said semiconductor wafer in said chamber.

14. The method as set forth in claim 13, wherein said first purge gas is selected from the group consisting of helium and nitrogen, and said second purge gas is selected from the group consisting of argon, neon, krypton and xenon.

15. The method as set forth in claim 13, wherein said first purge gas and said second purge gas are supplied to said chamber until said semiconductor wafer is sealed in said chamber.

16. The method as set forth in claim 13, wherein said first purge gas is supplied to said chamber so as to replace an atmosphere in said chamber with said first purge gas before said semiconductor wafer arrives at an entrance of said chamber in said step b), and said second purge gas is supplied to said chamber until said inserting is completed.

17. The method as set forth in claim 13, wherein said semiconductor wafer and other semiconductor wafers are interspaced and supported by a boat in said step a), and said boat is inserted into said chamber through an opening formed on a bottom side of said chamber.

18. The method as set forth in claim 17, in which said second purge gas evacuates residual oxygen from gaps between said semiconductor wafers.

19. The method as set forth in claim 13, in which said first purge gas is supplied to said chamber so as to replace an atmosphere in said chamber with said first purge gas before said semiconductor wafer arrives at an entrance of said chamber in said step b), and said second purge gas is supplied to said chamber until said inserting is completed.

* * * * *